(12) United States Patent
Hatch

(10) Patent No.: US 8,897,021 B2
(45) Date of Patent: Nov. 25, 2014

(54) METHOD FOR MANUFACTURING A PLURALITY OF PLUG-IN CARDS FROM A CARD BODY

(75) Inventor: David K. A. Hatch, Ross-on-Wye (GB)

(73) Assignee: Oberthur Technologies UK Limited, London (GB)

( * ) Notice: Subject to any disclaimer, the term of this patent is extended or adjusted under 35 U.S.C. 154(b) by 474 days.

(21) Appl. No.: 12/810,942

(22) PCT Filed: Dec. 26, 2007

(86) PCT No.: PCT/EP2007/064555
§ 371 (c)(1),
(2), (4) Date: Oct. 1, 2010

(87) PCT Pub. No.: WO2009/080126
PCT Pub. Date: Jul. 2, 2009

(65) Prior Publication Data
US 2011/0019367 A1    Jan. 27, 2011

(51) Int. Cl.
| | | |
|---|---|---|
| H05K 1/14 | (2006.01) |
| G06K 13/077 | (2006.01) |
| G06K 19/07 | (2006.01) |
| G06K 19/077 | (2006.01) |
| G06F 1/16 | (2006.01) |
| H05K 5/00 | (2006.01) |
| H05K 7/00 | (2006.01) |
| G03G 15/00 | (2006.01) |

(52) U.S. Cl.
CPC ........ G06K 19/07745 (2013.01); G06K 13/077 (2013.01); G06K 19/072 (2013.01); G06K 19/07739 (2013.01)

USPC .............. 361/737; 361/679.31; 361/679.32; 361/679.33; 361/679.37; 399/401

(58) Field of Classification Search
USPC ............. 361/737, 679.31, 679.32, 679.33, 361/679.37, 717; 399/401
See application file for complete search history.

(56) References Cited

U.S. PATENT DOCUMENTS

| | | | | |
|---|---|---|---|---|
| 6,805,286 | B2 * | 10/2004 | Hilton et al. | 235/379 |
| 7,344,325 | B2 * | 3/2008 | Meier et al. | 400/208 |
| 2002/0050527 | A1 * | 5/2002 | Nishikawa et al. | 235/492 |
| 2006/0006241 | A1 * | 1/2006 | Soyer et al. | 235/492 |
| 2007/0270039 | A1 * | 11/2007 | Froger et al. | 439/638 |

FOREIGN PATENT DOCUMENTS

| | | |
|---|---|---|
| DE | 40 40 296 | 1/1992 |
| DE | 199 26 348 | 12/2000 |
| DE | 19926348 A1 * | 12/2000 |

OTHER PUBLICATIONS

Y. Haghiri, "Vom Plastick zur Chipkarte", Hanser Verlag, München, Wien, pp. 159-180.

* cited by examiner

*Primary Examiner* — Hoa C Nguyen
*Assistant Examiner* — Binh Tran
(74) *Attorney, Agent, or Firm* — Cozen O'Connor

(57) ABSTRACT

A method for manufacturing a plurality of plug-in cards (25) from a card body (6), preferably on a standard sized, ISO 7810, ID1 type, the method comprising the steps of defining said plug-in cards (25) on the card body (6) and making at least one score line (19) on the card body to define the same plurality of similar plug-in support cards (33) each comprising a single plug-in card.

11 Claims, 5 Drawing Sheets

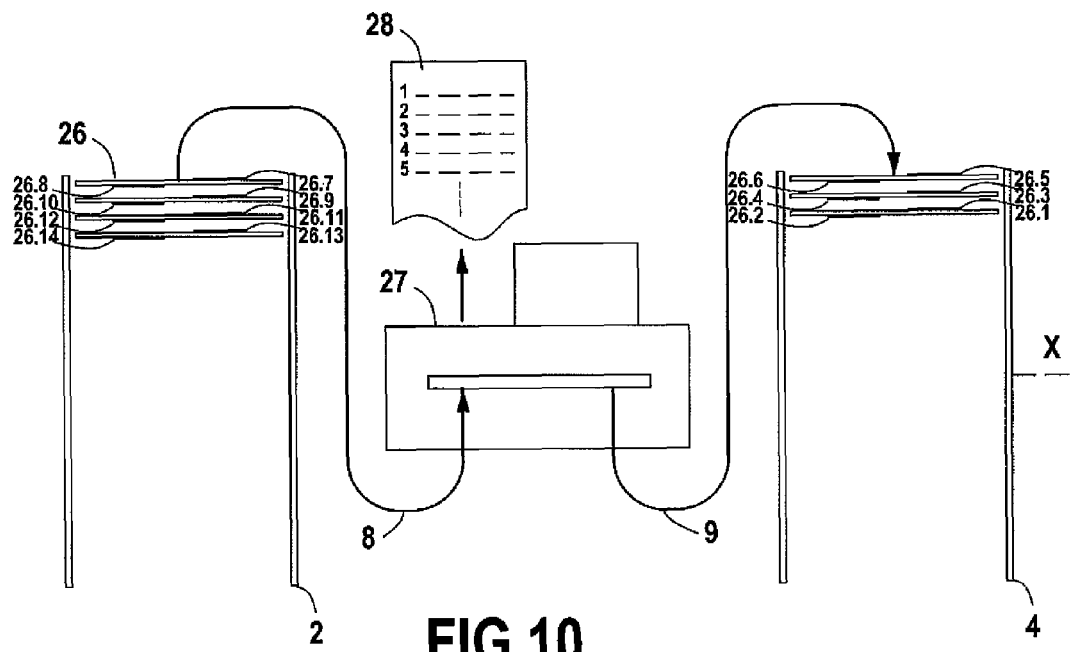
FIG.10
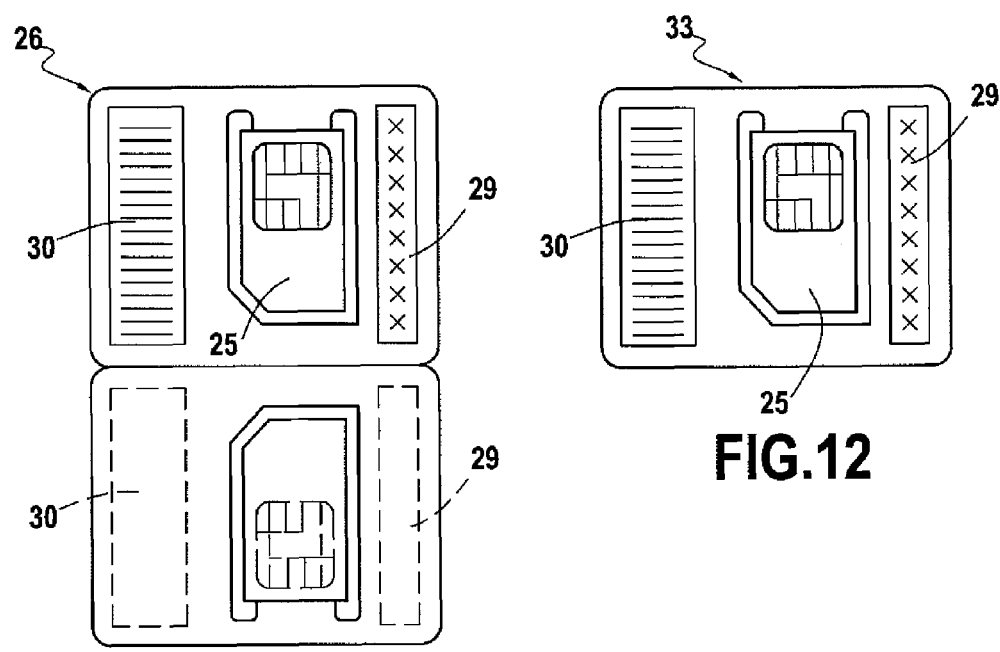
FIG.11
FIG.12

METHOD FOR MANUFACTURING A PLURALITY OF PLUG-IN CARDS FROM A CARD BODY

RELATED APLLICATIONS

This is a U.S. National Phase Application under 35 USC §371 of International Application PCT/EP2007/064555, filed on Dec. 26, 2007.

FIELD OF INVENTION

The present invention relates to chip cards, and to a method of manufacturing plug-in chip cards, and more particularly to multiple, break-out, or detachable, cards carried on a standard sized, ISO 7810, ID-1 type, card.

BACKGROUND OF INVENTION

The Subscriber Identity Module or SIM is a familiar component in the world of mobile telephony. Standard SIM cards are essentially small smart-cards: like most smart-cards, they comprise a module—an integrated circuit connected to a contact plate—embedded into a plastic substrate. The standard, ISO 7810, ID-1 card is more or less rectangular, with a width 85.6 mm and a height of 54 mm, whereas the standard, ISO 7810, ID-000 format, used for SIM cards is an irregular shape, though still clearly based on a rectangle, with a width of 25 mm and a height of 15 mm. This, much smaller card, is often referred to as a plug-in card, or a SIM plug. The larger ID-1 format used for smart cards facilitates insertion and removal of the card in and out of a card reader, something that may need to be done thousands of times during the lifetime of a typical smart card. A plug-in card, by contrast, is designed to be small, even if this means it is a little awkward to plug in or remove, because plugging in and removal are relatively infrequent operations. A recent addition to the family of miniature, plug-in cards for mobile telephones, is the so called Mini-UICC card or plug, this format, defined by ETSI, measures 15 mm in width, with a height of 12 mm.

By far the majority of plug-in cards are made by embedding a module into a standard, ID-1 sized, card body, and then punching a break-out slot, with the standard ID-000 card format, or the Mini-UICC format, around the module. The advantage of this approach is that it allows manufacturers to use standard, smart-card machine-tools for manufacturing and handling plug-in cards. And, while the plug-in card remains attached to its ID-1 card, it is easy for both the manufacturer and for the end user to handle. The principal disadvantage of this approach is that the plug-in card only represents a small proportion, about 10%, of the total area of an ID-1 card. Thus, when the plug-in card is broken out of the ID-1 card, 90% of the plastic is waste. The problem of waste is addressed by the European patent No. EP0495216, which describes an ID-1 format card with two break-out microchip cards, without describing the manufacturing procedure. The waste problem is also addressed by European patent, no. EP1073010, which describes an ID-1 format card with four break-out microchip cards, this patent also describes a manufacturing procedure. Both of these approaches reduce waste, but in cases where the two or four plug-in cards are destined for two or four different customers, the fulfilment and packaging process is complicated by the need to break out and handle the plug-in cards separately during the fulfilment and packaging process. What is needed is a way of putting, for example, at least two break-out plug-in cards onto an ID-1 card, that would allow the plug-in cards to be distributed to different customers without the additional cost and inconvenience of handling, and repackaging a 25 mm by 15 mm, or 15 mm by 12 mm component.

SUMMARY OF THE INVENTION

Accordingly, one aspect of the invention concerns a method for manufacturing plug-in cards, each plug-in card comprising one embedded module and being detachably defined within a larger plug-in support card, characterized in that a plurality of plug-in cards is defined in a card body and that at least one score line is made on the card body to define the same said plurality of similar plug-in support cards, each plug-in support card comprising a single plug-in card.

Advantageously, the dimensions of such a card body are those of a standard ISO 7810, ID-1 card. This allows one to use existing machines, with only minor modifications, to implement the method.

Advantageously the method is characterized by locating each said module with respect to the edges of said card body in conformity with ISO standard 7810 and 7816. Thus existing machines may be used to load the modules.

Another advantageous step is to punch radiused corners at the ends of said at least one score line. Thus each subsequently detached plug-in support card has four radiused corners.

Preferably plug-in cards with respective modules are embedded into opposite surfaces of said card body.

According to another advantageous step similar promotional information (such as logo, trademark, advertising) is printed on each plug-in support card.

The method may also include the step of printing personalized information on each plug-in support card. The method may also include the step of loading personalization information (that is data, programs, keys, codes . . . ) into the module of each plug-in card, correlated to the personalized information printed on the corresponding plug-in card. Of course, other data information, common to all the modules, may be loaded by the same data loading machine.

According to a possibility, the method is characterized by printing two distinct types of graphical information on said card body, a first type that is the same on each plug-in support card and a second type of personalized information that is not the same on each plug-in support card.

According to a further possibility, the method is characterized by loading two distinct types of electrical personalization information, a first type that is the same in each module and a second type of personalization information that is not the same in each module.

Furthermore, the method advantageously comprises the step of printing information onto said card body on-areas corresponding to respective plug-in support cards. This information is related to personalization information (algorithms, keys, SIM code) introduced in the module.

Thus, the plug-in card is delivered to customers, being attached to a printed information card after breaking the score line(s) of the smart cards. The printing steps and the loading of personalization data can be made during successive sequences or simultaneously for each module and associated information card. These steps are preferably executed before breaking the score line(s) although at least printing can be made on detached plug-in support cards.

Another aspect of the invention concerns a card body, characterized in that it comprises a plurality of plug-in cards defined therein and at least one score line to define the same said plurality of similar plug-in support cards therein, each plug-in support card comprising a single plug-in card with one embedded module.

According to another advantageous feature the card body is characterized by punched radiused corners at the ends of said at least one score line.

BRIEF DESCRIPTION OF THE DRAWINGS

FIG. 10 is a schematic representation of a card personalization station.

FIG. 11 shows the first personalized module and its associated card body personalization area after personalization.

FIG. 12 shows a mini-card or information card resulting from splitting a card along a score line.

DETAILED DESCRIPTION OF THE DRAWINGS

A possible embodiment of the method according to the present invention is described below with reference to FIGS. 1 to 12.

Figure 1:
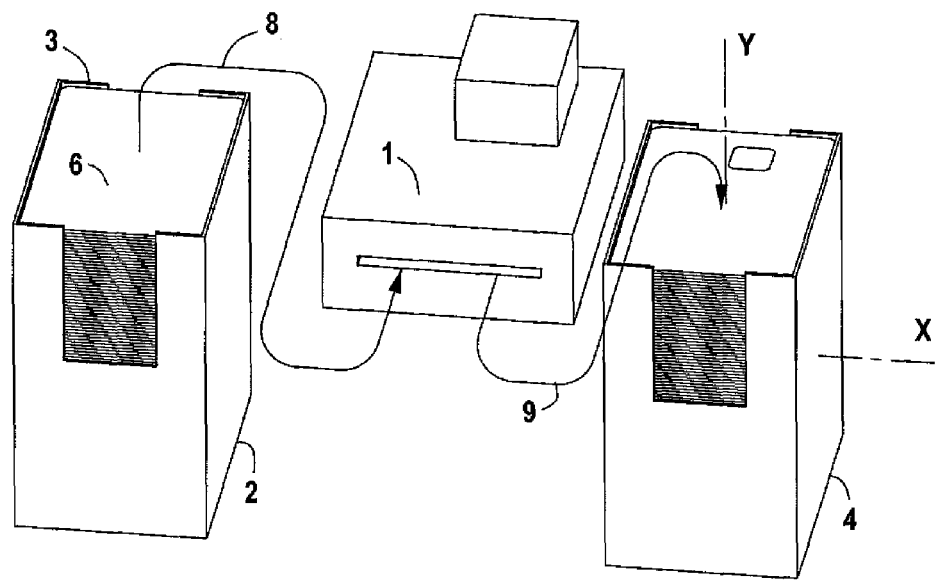
FIG. 1 is a schematic representation of a card milling station.
Figure 2:
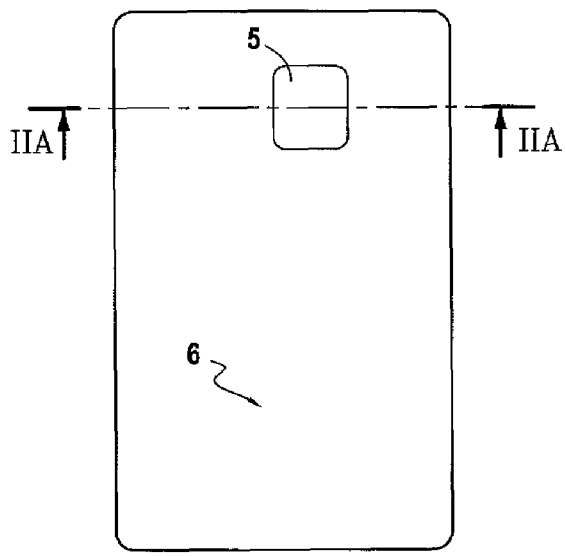
FIG. 2 shows the first milled surface of a card body after milling a first cavity.
Figure 3:
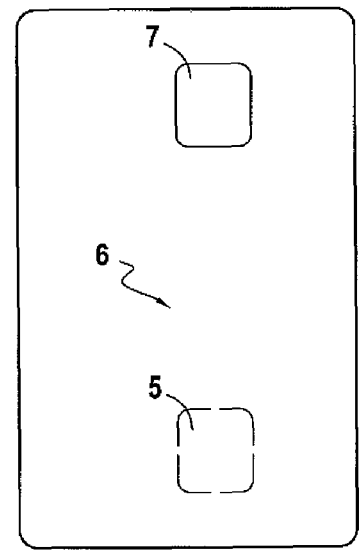
FIG. 3 shows the second milled surface of a card body after milling the second cavity.
Figure 2A:
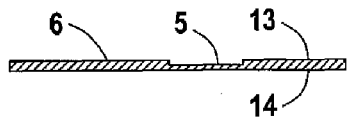
FIG. 2A is section along the line IIA-IIA of FIG. 2.

Referring to FIG. 1, a batch of card bodies 6, 500 for example, is loaded into an input hopper 2. A typical card body 6 is made from a thermoplastic, PVC for example, and its dimensions conform to the ID-1 format, specified in the ISO 7810 standard. The card bodies 6 form a stack in the hopper 2. A milling cycle is performed as follows: A card body 6 is removed, by means of a suction cup (not shown), from the top (or, in an alternative embodiment, bottom) of hopper 2 and fed (8) into a milling machine 1 (for example, a Cybernetics GRX 4000, supplied by the NBS Corporation, Ontario, Canada) which mills a cavity 5 into surface 13 of the card body 6. The card is then fed (9) out of the milling machine 1 and into the top (or, in an alternative embodiment, bottom) of the output hopper 4. The process continues until there are no further cards left in the input hopper. The output hopper 4 is removed, turned upside down through 180 degrees about the axis marked X in FIG. 1, and substituted for the empty input hopper. As the now full input hopper has been flipped, surface 13 of each card body 6 (with the milled cavity 5) is facing down. The process repeats: A card body 6 is removed, by means of a suction cup from the top (or, in an alternative embodiment, bottom) of the input hopper and fed (8) into the milling machine 1, which mills a cavity 7 (see FIG. 3) into surface 14 of the card body 6. The card is then fed (9) out of the milling machine 1 and into the top (or, in an alternative embodiment, bottom) of the output hopper. The process continues until there are no further cards left in the input hopper. Each finished, milled card-body has one cavity 5 milled into surface 13 of the card body 6, and one cavity 7 milled into surface 14 of the card body 6. Said milling cycle is complete.

In an alternative embodiment, both cavities are milled into the same surface of the card body. The same procedure as above is followed, except that output hopper 4 is turned through 180 degrees about the axis, known as the stacking axis, marked Y in FIG. 1.

In a further alternative embodiment, the milling machine is equipped with two heads positioned so as to allow both cavities to be milled into the card body in a single pass.

Figure 4:
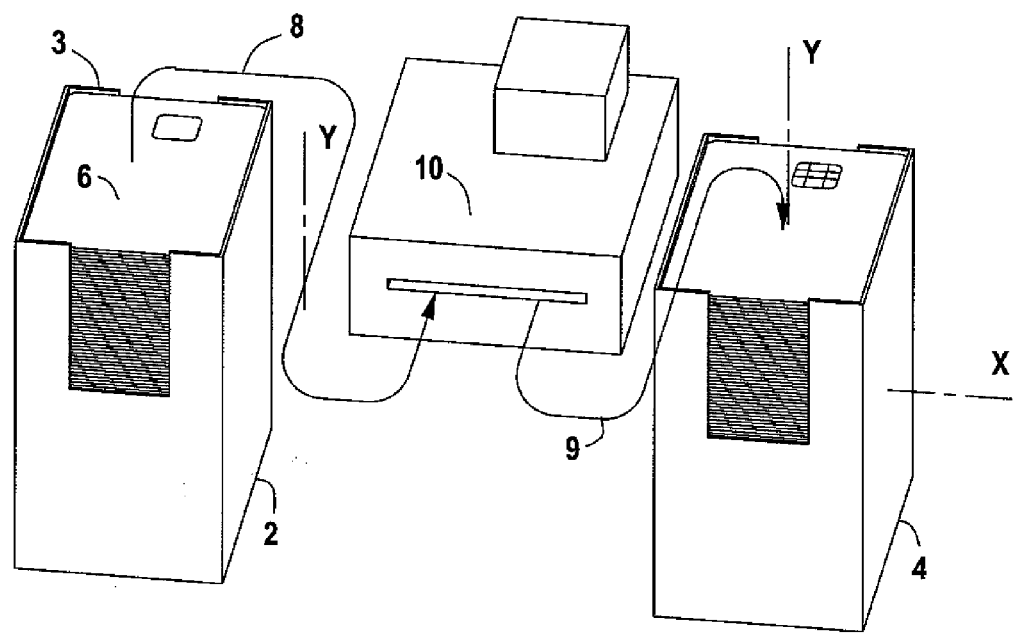
FIG. 4 is a schematic representation of a card embedding station.
Figure 5:
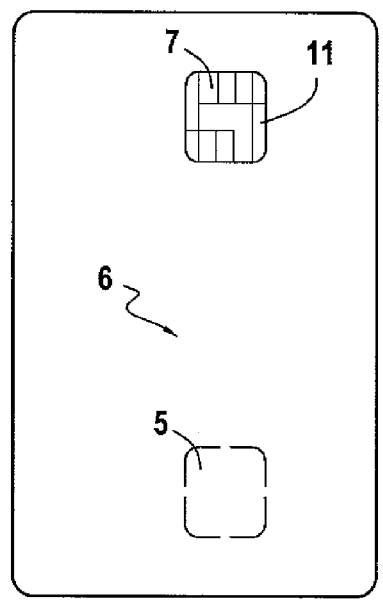
FIG. 5 shows the first embedded surface of a card body after embedding a first module.
Figure 6:
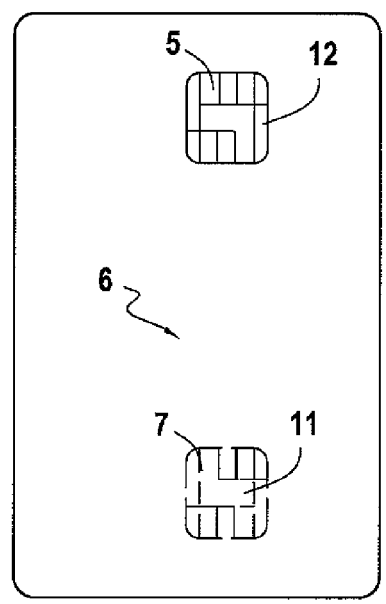
FIG. 6 shows the second embedded surface of a card body after embedding a second module.

Referring to FIG. 4, a batch of milled card bodies 6, 500 for example, is loaded into an input hopper 2. The milled card bodies 6 form a stack in the hopper 2. An embedding cycle is performed as follows. A milled card body 6 is removed, by means of a suction cup (not shown), from the top (or, in an alternative embodiment, bottom) of hopper 2 and fed (8) into an embedding machine 10 (for example, a Datacard ENC 3000, supplied by the Datacard corporation, Minnesota, US) which embeds a module 11 into cavity 7 on surface 14 of the card body 6. The card is then fed (9) out of the embedding machine 10 and into the top (or, in an alternative embodiment, bottom) of the output hopper 4. The process continues until there are no further cards left in the input hopper. The output hopper 4 is removed, turned upside down through 180 degrees about the axis marked X in FIG. 4, and substituted for the empty input hopper. As the now full input hopper has been flipped, surface 14 of the card body 6 with the embedded module 11 is facing down. A card body 6 is removed, by means of a suction cup from the top (or, in an alternative embodiment, bottom) of the input hopper and fed (8) into an embedding machine 10, which embeds a module 12 into cavity 5 on surface 13 of the card body 6. The card is then fed (9) out of the embedding machine 10 and into the top (or, in an alternative embodiment, bottom) of the output hopper. The process continues until there are no further cards left in the input hopper. Each finished embedded module card body 6 now has one module 12 embedded into surface 13 of the card body 6, and one module 11 embedded into surface 14 of the card body 6. Said embedding cycle is complete.

In the alternative embodiment, where both cavities are milled into the same surface of the card body, the same procedure as above is followed, except that output hopper 4, FIG. 4, is turned through 180 degrees about the axis Y, and not about the axis X.

Figure 7:
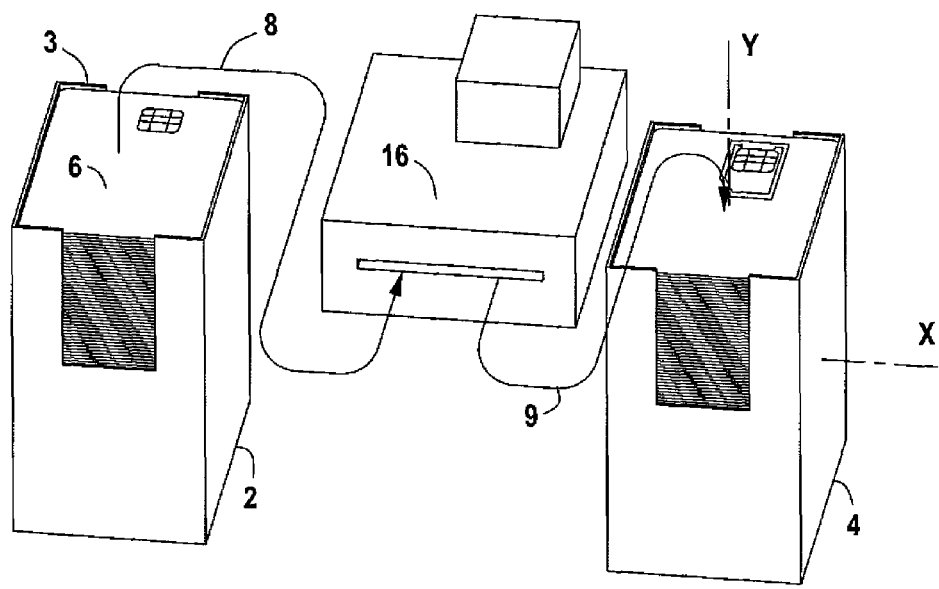
FIG. 7 is a schematic representation of a card punching station.
Figure 8:
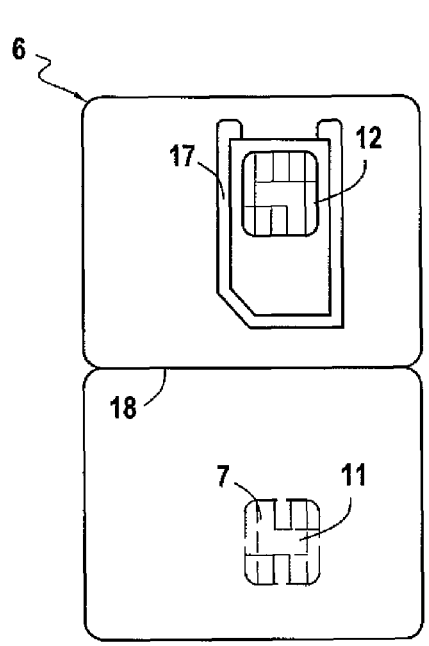
FIG. 8 shows the first punched surface of a card body after punching the first embedded module.

Referring to FIG. 7, a batch of milled, embedded card bodies 6, 500 for example, is loaded into an input hopper 2. An embedded card body 6 is removed, by means of a suction cup, from the top (or, in an alternative embodiment, bottom) of hopper 2 and fed (8) into a punching machine 16 (for example, a Mühlbauer CMP 2000, supplied by Mühlbauer A G, Roding, Germany) which punches a break-out slot 17 around module 12, and a double notched, central score line 18. Slot 17 also defines the contour of a plug-in card 25. The card is then fed (9) out of the punching machine 16 and into the top (or, in an alternative embodiment, bottom) of the output hopper 4. The process continues until there are no further cards left in the input hopper. The output hopper 4 is removed, turned upside down through 180 degrees about the axis marked X in FIG. 7, and substituted for the empty input hopper. As the now full input hopper has been flipped, surface 13 of the card body 6 with the embedded module 12 is facing down. A card body 6 is removed, by means of a suction cup from the top (or, in an alternative embodiment, bottom) of the input hopper and fed (8) into the punching machine 16, which punches a break-out slot 20 around module 11, and preferably another score line 19 facing the score line 18. The card is then fed (9) out of the punching machine 16 and into the top (or, in an alternative embodiment, bottom) of the output hopper 4. The process continues until there are no further cards left in the input hopper. Each card now has one module 12 surrounded by slot 17 embedded into surface 13 of the card body 6, and one module 11 surrounded by slot 20 embedded into surface 14 of the card body 6, and facing central score lines 18 and 19. In the present embodiment, the position, relative to the edges of the card, of the contact plates of the modules 11 and 12, is the position defined in the ISO standard 7810. This allows the two plug-in cards 25, provided, of course, they have not been broken out of their respective plug-in support cards, to be read by any standard smart card reader. The break-out slots 17, 20 allow the plug-in cards 25 with associated modules to be broken out by hand. The central score lines 18, 19 allow the card to be broken into two halves by hand. A particularity of the present invention lies in the arrangement of the score lines and the break-out slots 17, 20 around the plug-in cards. Due to the shift of the location of plug-in cards with respect to centre-line CC, the score line is broken by positioning the fingers on the largest portions of the card body aside the plug-in cards without breaking out said plug-in cards. The score lines are made by forming the two notches 21 and 22, and partially cutting into the surface of the card along lines 18 and 19. The depth of the partial cuts is such that, for example, by placing the right hand forefinger on surface 14 at approximately the position marked by 23 in FIG. 9, and the left hand forefinger on surface 14 at approximately the position marked by 24, with the thumbs opposing, placed directly underneath the forefingers on surface 13, it is easy to break the card in two, but at the same time, extremely unlikely that either of the two plug-in cards will break out.

Figure 9:
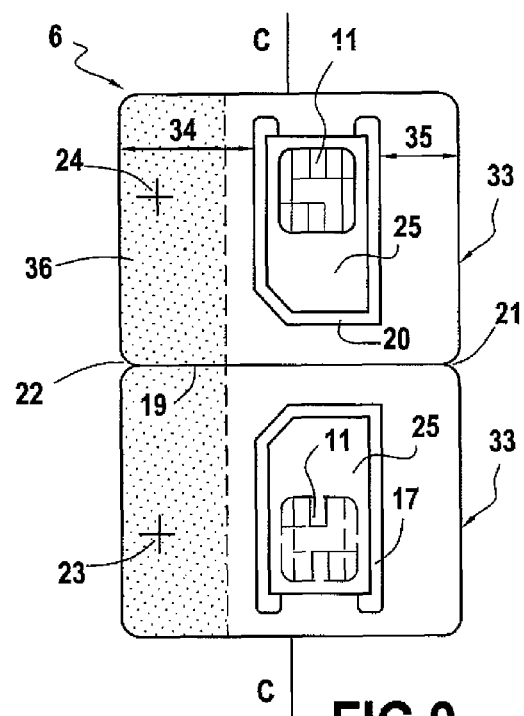
FIG. 9 shows the second punched surface of a card body after punching the second embedded module.

Placing the modules on opposite faces is advantageous: the ISO standard position requires that the plug-in cards be offset with respect to the centre-line CC, on FIG. 9, of the ID-1 card. The effect is shown by different lengths 34, 35 on FIG. 9. Placing the plug-in cards on opposite faces keep them aligned, so that the larger offset 34 defines the height of the safe handling area 36, where the card 6 can be conveniently held for breaking into mini plug-in support cards 33.

A further particularity lies in the fact that when the card is split as described above, the two mini-cards 33, called plug-in support cards, that result are, with regard to their length, width and the form of the break-out slot, geometrically similar. FIG. 12 shows a mini-card 33. Note the relationship between the plug-in card 25 and its surround, with areas available for both personalization and promotional information. There is enough space for number characters 29 and barcode characters 30, for example. The overall size of the mini-card, 54 mm by 42.8 mm, is adequate for ease of handling. The two mini-cards can, if necessary, be distributed independently.

Figure 14:
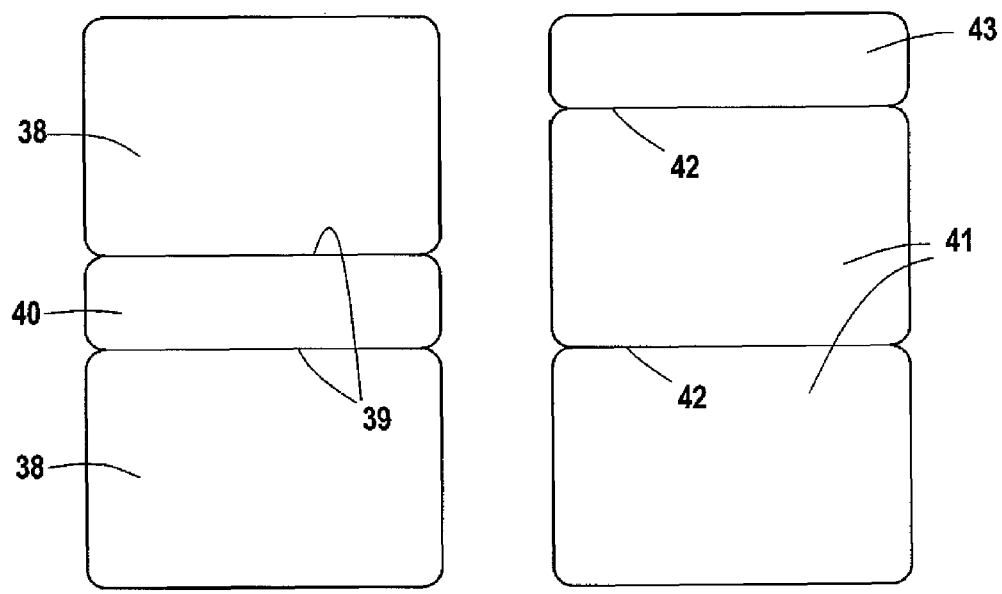
FIG. 14 shows other possible score line patterns.

By varying the position and or number of score lines and the positions of the modules, other similar mini-card formats are possible. FIG. 14 shows two alternative formats, the mini-card formats 38 and 41 are smaller than the mini-card 33. Each format has a double score line 39 and 42. The additional areas 40 and 43 could be used, for example, for a product code, or for other information that applies equally to both mini-cards.

In the alternative embodiment, where both modules are embedded into the same surface of the card body, the same procedure as above is followed, except that output hopper 4, FIG. 4, is turned through 180 degrees about the axis Y, and not about the axis X.

In a further alternative embodiment, the punch is equipped to allow the two break-out slots, and the central score line with the two notches, to be punched out in a single pass.

Figure 13:
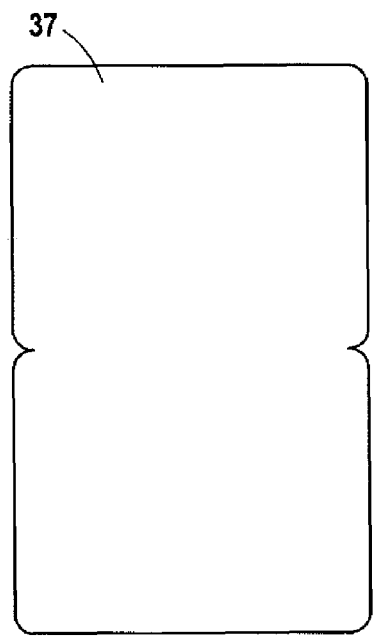
FIG. 13 shows a pre-notched card body.

In a further alternative embodiment, the card body 3 in FIG. 1 is replaced by a pre-notched card body 37 shown in FIG. 13.

According to a further important peculiarity, the method according to the invention is characterized in that it comprises the steps of providing a batch of said punched card bodies as a stack in an input hopper and performing a personalization and/or printing cycle by transferring successively each said card body from said input hopper to a personalization and/or printing machine for entering personalization information within at least one module and/or printing corresponding information on the area of the corresponding plug-in support card and transferring each card body from said personalization and/or printing machine to an output hopper in order to form a stack of personalized and/or printed card bodies therein.

Personalization individualizes the cards. Before personalization, a batch of cards has no particular order, after personalization every batch is sequentially ordered. Cards are personalized by reference to a personalization table 28, which can be a sequence of records. The batch of cards to be personalized is loaded into an input hopper 2, at this point the cards are unordered. A card is removed from one end, call it the out-feed end, of the input hopper 2 of FIG. 10, the card is then personalized in a personalization and printing machine 27 with reference to a record, call it record n, and fed into an end of the output hopper 4, call it the in-feed end. The next card is removed from the out-feed end of the input hopper and personalized with reference to record next(n) (where next is a function that computes the next record number in the sequence) and fed into the in-feed end of the output hopper. This process continues until there are no further cards in the input hopper. At this point the cards in the output hopper are ordered. The last card in the sequence is the card at, or closest to, the in-feed end of the hopper, and the first card in the sequence is the card at the end opposite to the in-feed end, that is, the out-feed end of the hopper. This sequencing technique can be adapted to multiple passes over the same batch, by adapting the sequencing function next(n). For example, where there are two modules per card to personalize. The first pass, personalizes one of the two modules on each card, and establishes the order, 1, 3, 5, etc., of personalized modules. The second pass, takes the cards from the out-feed end of the hopper containing the odd-number, ordered sequence, and personalizes the unpersonalized chip on each card, according to the sequence 2, 4, 6, etc. This results in an overall sequence of 1, 2, on the first card, 3, 4 on the second card, and so on.

Ordering personalized cards, and then maintaining the imposed order throughout the personalization process, makes it much easier to collate the personalized cards with personalized packaging, or other personalized fulfilment documents.

In FIG. 10, the output hopper contains 3 cards, the modules 26.1, 26.3 and 26.5, with their associated card body personalization areas 29, 30 having been personalized by reference to records 1, 3 and 5 respectively. The modules 26.2, 26.4 and 26.6, with their associated card body personalization areas, remain unpersonalized. The next, punched, embedded card 26 is removed, by means of a suction cup, from the top of hopper 2 and fed (8) into the personalization and printing machine 27 (for example, a Datacard MPR 5800, supplied by the Datacard corporation, Minnesota, US) which personalizes module 26.7 and its associated card body personalization areas 29, 30 by reference to record 7 in table 28. The area 29 is typically used for printing human readable information and the area 30 for a barcode, or other machine readable information. The card is then fed (9) out of the personalization machine 27 and into the top of the output hopper 4. The process continues until there are no further cards left in the input hopper. The output hopper 4 is removed, turned upside down through 180 degrees about the axis marked X in FIG. 10, and substituted for the empty input hopper. The card with module 26.2 is now at the top of the input hopper. This card is removed, by means of a suction cup from the top of the input hopper and fed (8) into the machine 27, which personalizes module 26.2 by reference to record 2 in table 28. The card is then fed (9) out of the personalization and printing machine 27 and into the top of the output hopper. The process continues, with reference to the even numbered records in table 28, until there are no further cards left in the input hopper.

In an alternative embodiment, the cards to be personalized are those with the two modules embedded on the same surface of the card, punched as described above. The cards are personalized, with the order imposed as described above, in the example case, with odd and even numbered passes. After the first, or odd numbered pass, the hopper is rotated through 180 degrees about its vertical axis.

In a further alternative embodiment, the personalization machine is equipped to allow both modules and their respective card body personalization areas, to be personalized in a single pass.

It is to be noted that the personalization and printing machine 27 although preferred, can be replaced by a personalization machine (for data personalization of the module) and a printing machine (for printing on areas 29, 30) and with separate cycles, as described above, for electrical and print personalization.

The order of some of the cycles may be different. For example, the embedding cycles may be performed after the punching cycles. Personalization and/or printing cycles may be performed in a different location, later, for example by a client of the card manufacturer.

The invention claimed is:

1. A method of manufacturing plug-in cards, each plug-in card comprising one embedded module and being detachably defined within a larger plug-in support card, wherein a plurality of plug-in cards is defined in a card body and at least one score line is made on the card body to define the same said plurality of similar plug-in support cards, each plug-in support card comprising a single plug-in card after breaking said score line; said method comprising sequences performing respective operations, wherein at least one of said sequences comprises two cycles of similar steps as follows:

providing an input hopper and an output hopper, wherein the output hopper is structurally configured to be attachable in any of a first and a second orientation, the second orientation being turned 180 degrees about a horizontal axis from the first orientation;

setting a batch of card bodies as a stack in said input hopper;

performing a cycle of the corresponding sequence by transferring successively each card body from said input hopper to a machine designed for performing a corresponding operation;

transferring each said card body from said machine to said output hopper in order to form a stack of operated card bodies therein;

removing and turning the output hopper and substituting said turned output hopper for the input hopper; and performing another cycle of the corresponding sequence.

2. The method according to claim 1, wherein one of said sequences is a milling sequence for milling at least one cavity in each transferred card body during each corresponding cycle of the sequence.

3. The method according to claim 1, wherein one of said sequences is an embedding sequence for embedding modules into respective plug-in support cards during each corresponding cycle of the sequence.

4. The method according to claim 1, wherein one of said sequences is a punching sequence for providing break-out slots defining the contours of said plug-in cards during each corresponding cycle of the sequence.

5. The method according to claim 1, wherein one of said sequences is a sequence for entering personalization information within modules or printing information on the area of the corresponding plug-in support cards, during each corresponding cycle of the sequence.

6. The method according to claim 1, wherein the step of removing and turning the output hopper comprises turning the output hopper upside down.

7. The method according to claim 1, wherein the step of removing and turning the output hopper comprises turning the output hopper by 180 degrees around a stacking axis.

8. The method according to claim 1, wherein:

one of said sequences is a milling sequence for milling at least one cavity in each transferred card body during each corresponding cycle;

one of said sequences is an embedding sequence for embedding modules into respective plug-in support cards during each corresponding cycle;

one of said sequences is a punching sequence for providing break-out slots defining the contours of said plug-in cards during each corresponding cycle; and one of said sequences is a sequence for entering personalization information within modules or printing information on the area of the corresponding plug-in support cards, during each corresponding cycle.

9. The method according to claim 8, wherein the step of removing and turning the output hopper comprises turning the output hopper upside down.

10. The method according to claim 8, wherein the step of removing and turning the output hopper comprises turning the output hopper by 180 degrees around a stacking axis.

11. The method according to claim 1, wherein the output hopper is further structurally configured to allow removal of card bodies from either one of an opening at a first end and an opening at a second end of the output hopper, depending upon whether the output hoper is oriented in the first or the second orientation.

* * * * *